(12) United States Patent
Han et al.

(10) Patent No.: US 6,858,470 B1
(45) Date of Patent: Feb. 22, 2005

(54) METHOD FOR FABRICATING SEMICONDUCTOR PACKAGES, AND LEADFRAME ASSEMBLIES FOR THE FABRICATION THEREOF

(75) Inventors: Byung Joon Han, Singapore (SG); Byung Hoon Ahn, Singapore (SG)

(73) Assignee: ST Assembly Test Services Ltd., Singapore (SG)

( * ) Notice: Subject to any disclaimer, the term of this patent is extended or adjusted under 35 U.S.C. 154(b) by 0 days.

(21) Appl. No.: 10/682,273

(22) Filed: Oct. 8, 2003

(51) Int. Cl.[7] ............................................. H01L 21/50
(52) U.S. Cl. .................. 438/112; 438/106; 438/111; 438/113; 438/123; 438/124; 438/126; 438/127
(58) Field of Search ........................ 438/106, 111–113, 438/123–124, 126–127

(56) References Cited

U.S. PATENT DOCUMENTS 6,333,564 B1 * 12/2001 Katoh et al. ................ 257/780
6,608,366 B1 * 8/2003 Fogelson et al. ........... 257/666

* cited by examiner

*Primary Examiner*—George Fourson
*Assistant Examiner*—Thanh Pham
(74) *Attorney, Agent, or Firm*—Mikio Ishimaru

(57) ABSTRACT

A method for fabricating semiconductor packages provides a leadframe for packages that are to be singulated with respective predetermined package body sizes. Individual mold caps are formed on the leadframe with mold cap dimensions that are larger than the respective predetermined package body sizes. The mold caps and leadframe are sawed to singulate packages therefrom. The sawing reduces the dimensions of the mold caps to the respective predetermined package body sizes.

13 Claims, 5 Drawing Sheets

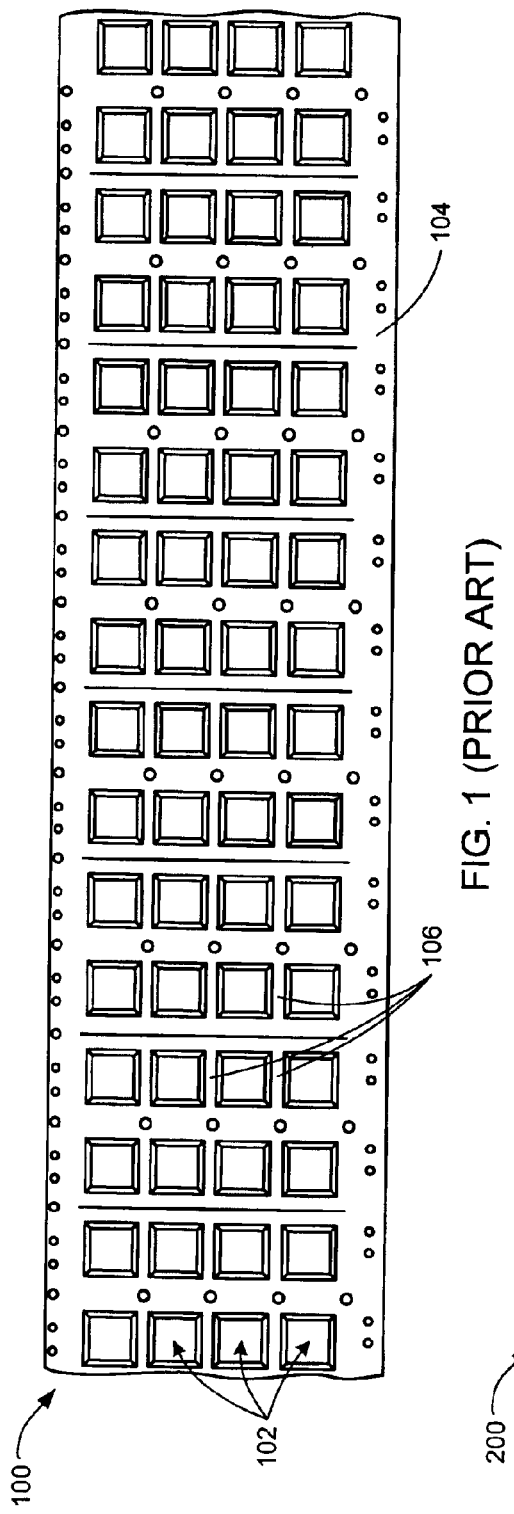
FIG. 1 (PRIOR ART)
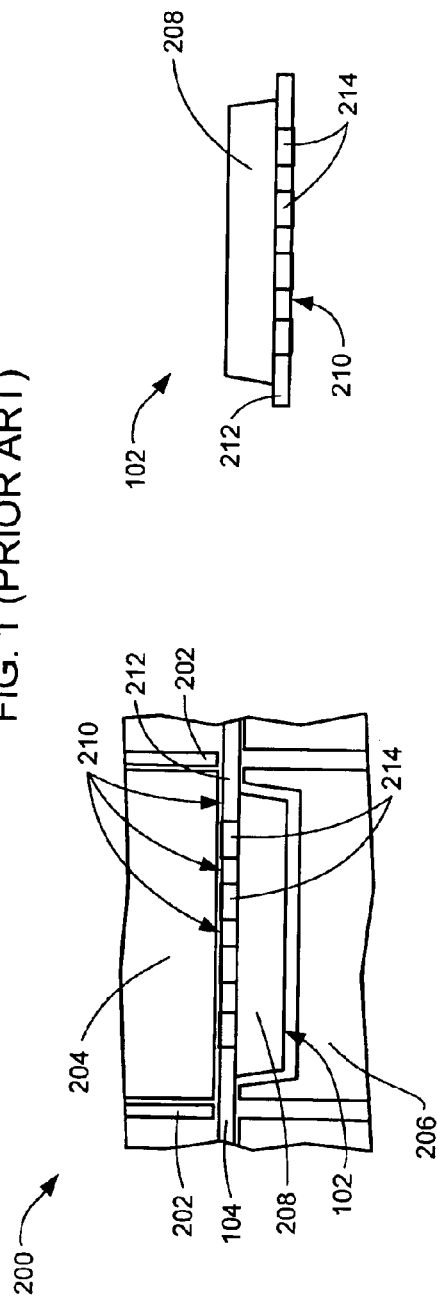
FIG. 2 (PRIOR ART)
FIG. 3 (PRIOR ART)

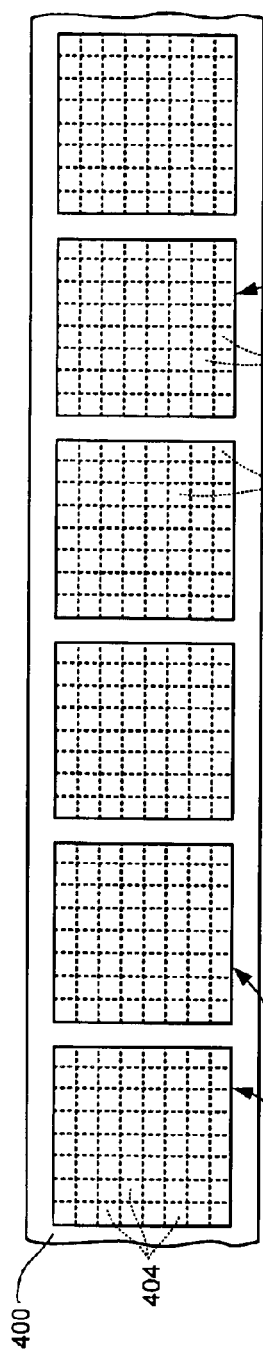
FIG. 4 (PRIOR ART)
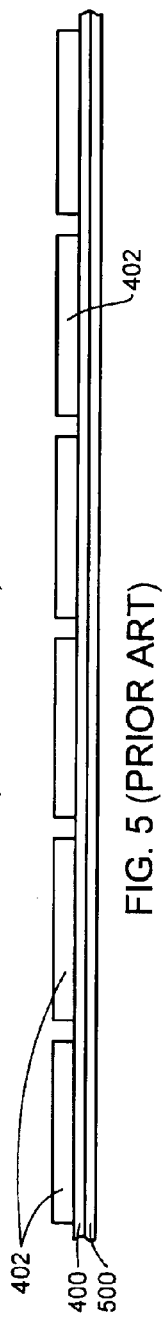
FIG. 5 (PRIOR ART)
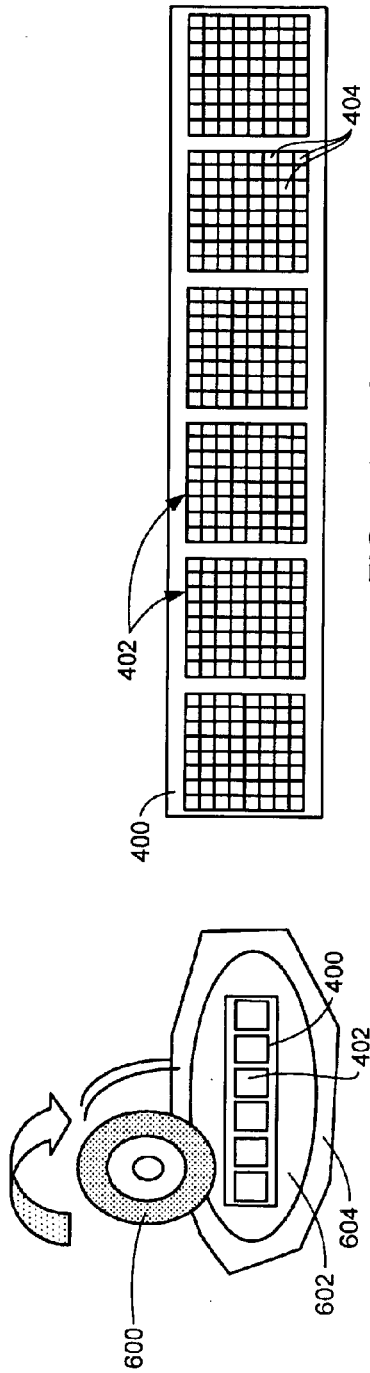
FIG. 7 (PRIOR ART)
FIG. 6 (PRIOR ART)

METHOD FOR FABRICATING SEMICONDUCTOR PACKAGES, AND LEADFRAME ASSEMBLIES FOR THE FABRICATION THEREOF

TECHNICAL FIELD

The present invention relates generally to semiconductor devices, and more particularly to a method for fabricating semiconductor packages and to leadframe assemblies utilized in the fabrication thereof.

BACKGROUND ART

Continuing progress in integrated circuit ("IC") technology continues to lead to higher and higher levels of circuit integration. This is a result of the computer industry's relentless drive toward higher performance, lower cost, increased miniaturization of components, and greater packaging density of integrated circuits. As new generations of integrated circuit products are released, the functionality of those products increases while the number of components used to fabricate them decreases.

Semiconductor devices are constructed from a silicon or gallium arsenide wafer through a process that comprises a number of deposition, masking, diffusion, etching, and implanting steps. Usually, many individual devices are constructed on the same wafer. When the devices are separated into individual rectangular units, each takes the form of an IC die.

In order to connect a die with other circuitry, it is common to mount it on a leadframe or on a multi-chip module substrate that is surrounded by a number of contact connections. Each die has bonding pads that are then individually connected in a wire-bonding operation to the leadframe's contact connections, using extremely fine gold or aluminum wires. The assemblies are then completed by individually encapsulating them in molded plastic or ceramic bodies called "packages". With continuing technology improvements, packages themselves are also achieving higher and higher density.

The chip scale package ("CSP") is a popular package configuration in the semiconductor industry. The size of a CSP package is only slightly larger than the IC chip, or die, that it encapsulates. The CSP therefore saves considerable space over earlier, larger configurations. In addition, since the smaller CSP size shortens internal signal transmission paths, the CSP also improves product performance.

The chip carrying structures within a CSP commonly include a leadframe that provides mechanical support for the individual IC device die. The leadframe also provides interconnect lines that enable the die to be connected electrically to surrounding circuitry.

Since the CSP leadframe is usually low in cost and easy to work with, it has become a popular package configuration for consumer electronic products. Popular leadframe-based CSP's are the quad flat nolead ("QFN") package, the micro leadframe package ("MLP"), and the bottom leaded package ("BLP"). Popular leadless CSP's include various flip chip style packages such as the ball grid array ("BGA") and the slightly larger than IC carrier ("SLICC"). Leadless CSP's have the additional advantage of shorter signal transmission paths and lower signal attenuation.

A conventional semiconductor package is typically manufactured in quantity in an assembly process that requires a custom mold and a custom form tool. Thus, the tooling cost for manufacturing a new package can be high. Therefore, rather than creating a package that is optimized specifically for a given IC size and input/output ("I/O") configuration, a designer often compromises by selecting an already available package instead. The selection is done by matching the size and I/O terminal requirements of the IC as closely as possible to available packages for which the tooling investment has already been made. In such a case, unfortunately, the resulting package is optimized for neither density nor material cost.

During manufacturing of semiconductor packages, they are typically connected together either in an array or in a strip configuration. The individual packages must then be separated from each other. The separation process is referred to as "singulation". Contemporary singulation uses either a sawing process or a punching process to separate the individual semiconductor packages. Punch singulation and saw singulation technologies are efficient and well developed.

However, there are still significant disadvantages with both punch singulation and saw singulation. For example, punch singulation wastes leadframe space (circuit area), can suffer from debris damage, and requires molds and singulation dies that are individually sized for each leadframe body size. This causes increased tooling investments or suboptimized design compromises. Saw singulation processes can form voids, can suffer strip warpage from differences in the thermal expansion of the material layers used, and can be impaired by materials that outgas.

Solutions to these problems have been long sought but prior developments have not taught or suggested any solutions and, thus, solutions to these problems have long eluded those skilled in the art.

DISCLOSURE OF THE INVENTION

The present invention provides a method for fabricating semiconductor packages. A leadframe is provided for packages that are to be singulated with respective predetermined package body sizes. Individual mold caps are formed on the leadframe with mold cap dimensions that are larger than the respective predetermined package body sizes. The mold caps and leadframe are sawed to singulate packages therefrom. The sawing reduces the dimensions of the mold caps to the respective predetermined package body sizes.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 (PRIOR ART) is a top view of a prior art leadframe with molded semiconductor packages;

FIG. 2 (PRIOR ART) is a prior art package singulation punching configuration;

FIG. 3 (PRIOR ART) is a prior art package resulting from singulation punching as illustrated in FIG. 2 (PRIOR ART);

FIG. 4 (PRIOR ART) is a top view of a prior art tape-attached-leadframe with block molded semiconductor packages formed thereon;

FIG. 5 (PRIOR ART) is a side view of the prior art tape-attached leadframe and packages shown in FIG. 4 (PRIOR ART);

FIG. 6 (PRIOR ART) figuratively illustrates prior art singulation of semiconductor package blocks by sawing;

FIG. 7 (PRIOR ART) shows a strip of package blocks after sawing singulation;

BEST MODE FOR CARRYING OUT THE INVENTION

Figure 8:
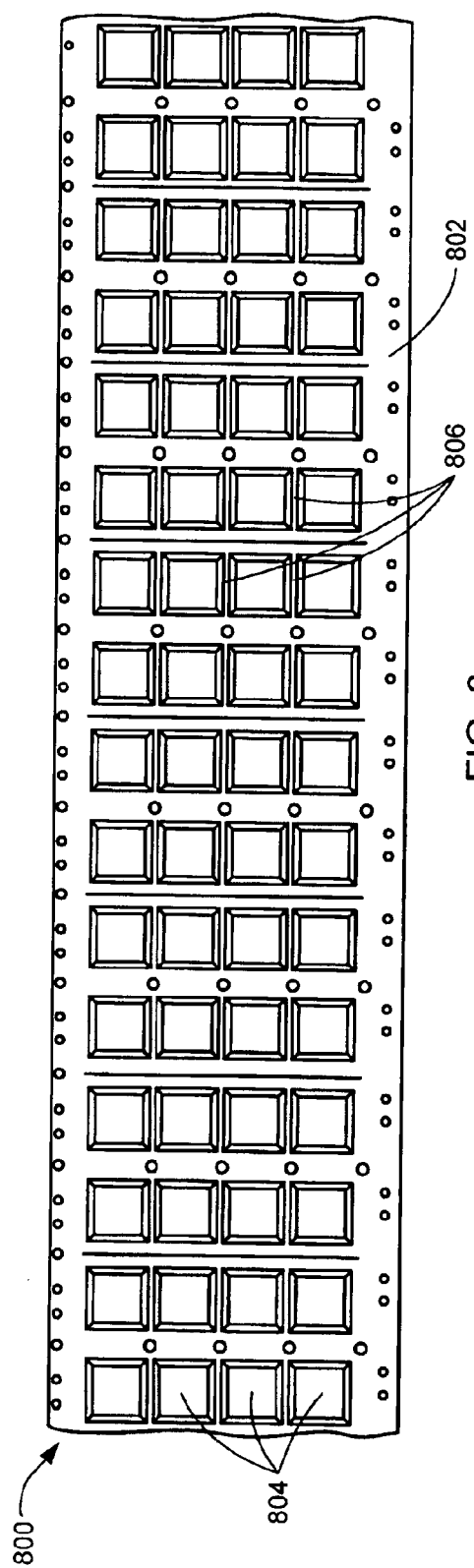
FIG. 8 is a view of a leadframe and mold cap array in accordance with the present invention.

In the following description, numerous specific details are given to provide a thorough understanding of the invention. However, it will be apparent that the invention may be practiced without these specific details. In order to avoid obscuring the present invention, some well-known configurations and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. Also, where multiple embodiments are disclosed and described having some features in common, for clarity and ease of illustration and description thereof like features one to another will ordinarily be described with like reference numerals.

The term "horizontal" as used herein is defined as a plane parallel to the conventional major plane or surface of the semiconductor package, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

In fabricating semiconductor packages, two common types of quad leadless packages ("QLP's") are differentiated by their singulation methods. One type is singulated by punching the individual packages from a leadframe on which the package mold caps have been formed in an array by pocket molding. The other type is singulated by sawing the individual packages from a tape-attached leadframe on which the package mold caps have been formed serially by block molding.

Referring now to FIG. 1 (PRIOR ART), therein is shown a top view of a prior art leadframe and mold cap array 100 having molded semiconductor packages 102 formed on a leadframe 104 and ready for singulation by punching. The leadframe 104 is a conventional, standard leadframe, and the molded semiconductor packages 102 are prepared by standard, conventional pocket molding, with spacings 106 therebetween. (In pocket molding, each chip is encapsulated in a separate molded body, allowing a singulation punch to be used to cut the leadframe between adjacent molded bodies. This is in contrast to block molding, wherein several chips on a strip or array are encapsulated within a single molded body.)

Referring now to FIG. 2 (PRIOR ART), therein is shown a prior art package singulation punching configuration 200. The punching configuration 200 includes a punch 202, a stripper 204, and a punch die 206. An array of such punches, strippers, and die are then conventionally configured for simultaneously singulating the molded semiconductor packages 102 from the prior art leadframe and mold cap array 100.

More particularly, the molded semiconductor packages 102 each include a mold cap 208 that has been formed on a corresponding leadframe body 210 on the leadframe 104. As is known in the art, the leadframe body 210 is the portion of the leadframe 104 that is laterally co-extensive with the punch die 206 and fits within the dimensions of the punch 202.

Singulation is then effected by receiving the molded semiconductor packages 102 individually in respective individual punch die 206 and then driving the punches 202 through the leadframe 104 and against the punch die 206. This cuts the leadframe 104 against the punch die 206 and thereby separates (singulates) the molded semiconductor packages 102.

As can be seen, the size of the mold cap 208 must be smaller than the size of the leadframe body 210 in order to have room for the punch 202, the stripper 204, and the punch die 206. This results in formation of a portion 212 of the leadframe body 210 that is peripheral to and outside the environmental and physical protection of the mold cap 208.

Since the portion 212 is outside and unprotected by the mold cap 208, the portion 212 cannot be utilized for internal circuit connections and lead routing. Similarly, it is generally unsuitable for external electrical contacts such as the contact leads 214. Therefore, since the punch singulation operation requires the leadframe body 210 to be larger than the mold cap 208, the resulting exposed nonfunctional periphery (the portion 212) causes and forms a larger than necessary package that wastes space.

Another disadvantage of punch singulation is the tendency of the relatively weak material of the leadframe 104 to tear at the sheer or cutting line between the punch 202 and the punch die 206. This can damage the environmental integrity of the molded semiconductor package 102. It can also leave debris that may subsequently be shed and cause problems (for example, by causing damage to a disk drive).

Other disadvantages of punch package singulation include the need for individualized mold sizes and individualized punch and punch die sizes for each package body size. Nevertheless, punch singulation is popular because the process is easy and provides a high product output.

Referring now to FIG. 3 (PRIOR ART), therein is shown an individual molded semiconductor package 102 resulting from prior art singulation punching, as illustrated in FIG. 2 (PRIOR ART), of the prior art leadframe and mold cap array 100 (FIG. 1 (PRIOR ART)).

Referring now to FIG. 4 (PRIOR ART) and FIG. 5 (PRIOR ART), therein are shown, respectively, top and side views of a prior art tape-attached leadframe 400. In conventional fashion, semiconductor package blocks 402 are formed by block molding on the tape-attached leadframe 400, which in turn is attached to and supported on a tape 500 (FIG. 5 (PRIOR ART)). The individual semiconductor packages 404 that are to be singulated from the semiconductor package blocks 402 are illustrated in phantom.

Referring now to FIG. 6 (PRIOR ART), therein is shown a figurative illustration of prior art sawing singulation of the strip of the semiconductor package blocks 402 into individual semiconductor packages. In particular, after the tape 500 (FIG. 5 (PRIOR ART)) is removed from the leadframe 400, the individual semiconductor packages 404 (FIG. 4 (PRIOR ART)) in the semiconductor package blocks 402 are separated by a saw 600. For example, the mold strip may be mounted in conventional manner on a film 602 on a film frame 604, as illustrated, or it may be mounted on a chuck (not shown), for sawing singulation by the saw 600.

Referring now to FIG. 7 (PRIOR ART), therein is shown a strip of the package blocks 402, such as shown in FIG. 6 (PRIOR ART), after sawing singulation.

Sawing singulation has several advantages. More space can be provided between the individual packages. It is not necessary to fabricate mold sizes individually per leadframe body size. It is not necessary to fabricate individual singulation die sizes per leadframe body size.

An additional advantage is that the mold cap can be the same size as the leadframe body. This allows additional routing for a given size than is attainable with package singulation by punching. Alternatively, saw singulation allows a smaller package size for the same routing configuration compared with package singulation by punching.

Package singulation by sawing, however, has several disadvantages. For example, it requires attaching the leadframe to a tape in order to perform the block molding of the package mold caps. Attaching the leadframe to a tape introduces additional cost. It can also introduce process difficulties due to differences in thermal expansion coefficients between the tape and the leadframe. Such thermal expansion coefficient differences can lead to warpage of the tape-attached leadframe strip.

A tape-attached leadframe strip can also cause reliability and quality concerns from outgassing of the tape during the curing process for the mold caps. Quality control can also be more difficult and/or expensive since special leadframes and equipment may be necessary to identify packages that must be rejected due to failures that occur in the wire-bonding and molding processes.

It has been discovered, as taught by the present invention, that it is possible to obtain the benefits of punch singulation processing and the benefits of saw singulation processing while avoiding the disadvantages. Thus, as taught by the present invention, a standard array leadframe, for example of the type used for QLP punch singulation, can be utilized instead for saw singulation by providing the array leadframe with a newly discovered mold cap configuration. Since a tape-attached leadframe is then not needed for singulating the packages by sawing, prior disadvantages are resolved, such as those caused by outgassing, by differences of thermal expansion coefficients, and by difficulties in identifying defective packages that need to be rejected. Better mold cap formation is also afforded since the mold caps can be formed individually by pocket molds. Pocket molding enables better control of the mold flow (for example, turbulent flow prevention), thereby reducing voiding risks that are seen with block molding on a tape-attached leadframe.

Referring now to FIG. 8, therein is shown a leadframe assembly, and more particularly a leadframe and mold cap array 800, configured in accordance with the present invention. The leadframe and mold cap array 800 includes a leadframe 802 that may be, for example, similar to a standard array leadframe such as the leadframe 104 (FIG. 1 (PRIOR ART)) that is used for package singulation by punching. Thus, the leadframe 802 is a tape free leadframe.

However, unlike prior art standard array leadframes such as the leadframe 104 (FIG. 1 (PRIOR ART)), the leadframe and mold cap array 800 includes individual mold caps 804 that are noticeably larger in their lateral dimensions than the sizes of the individual leadframe bodies over which the mold caps 804 are formed. The mold caps 804 and the leadframe bodies contained therein, having spacings 806 therebetween, are preferably also closer together than in corresponding prior art standard array leadframes such as the leadframe 104. In particular, they are closer together than the spacings 106 (FIG. 1 (PRIOR ART)) of leadframe bodies and mold caps for a corresponding punch singulation leadframe array.

Figure 9:
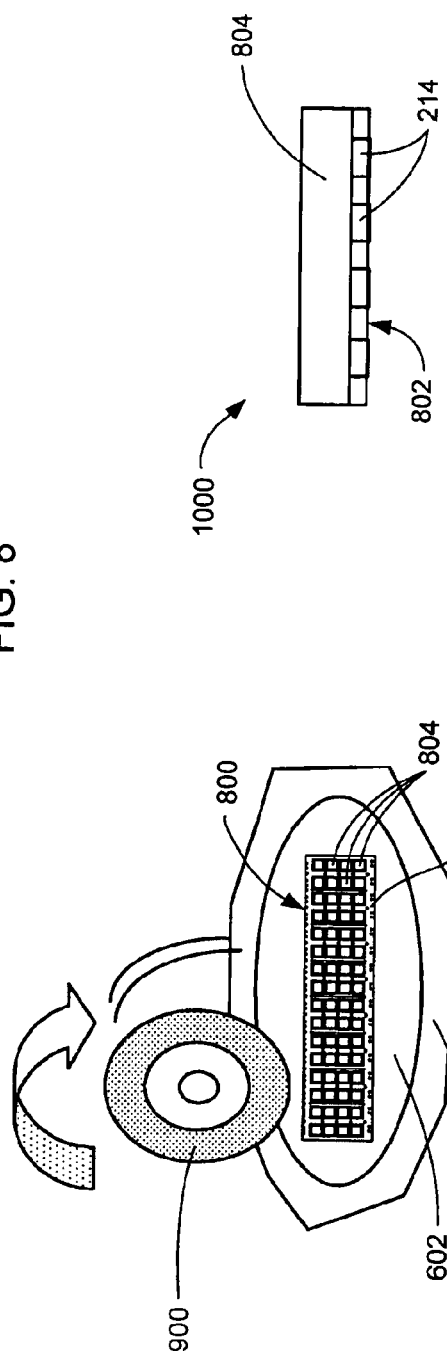
FIG. 9 is a figurative illustration of sawing singulation of semiconductor packages from the leadframe and mold cap array shown in FIG. 8.

Referring now to FIG. 9, therein is shown a figurative illustration of sawing singulation by a saw 900 of semiconductor packages 1000 (see FIG. 10) from the leadframe and mold cap array 800 (FIG. 8).

Figure 10:
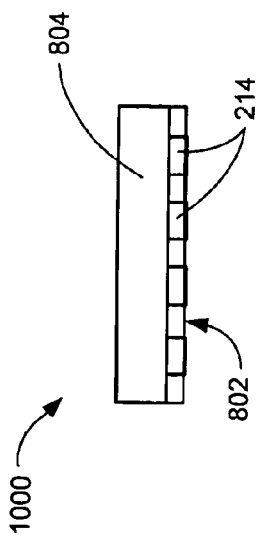
FIG. 10 is a figurative illustration of an individual molded semiconductor package resulting from the sawing singulation illustrated in FIG. 9.

Referring now to FIG. 10, therein is shown a figurative illustration of an individual molded semiconductor package 1000 resulting from the sawing singulation illustrated in FIG. 9 of the leadframe and mold cap array 800 (FIGS. 8 and 9).

Figure 11:
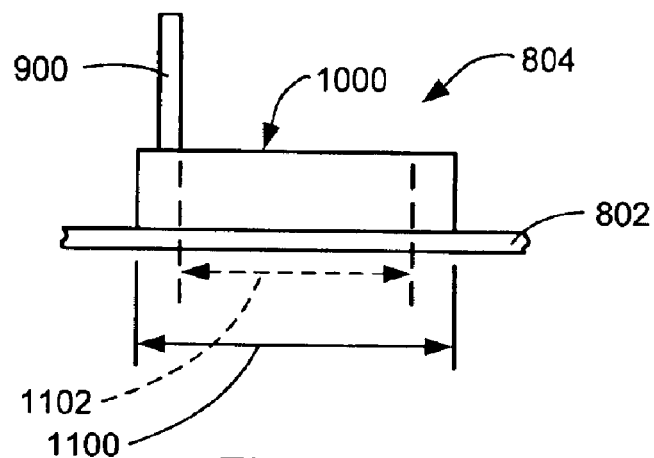
FIG. 11 is an enlarged figurative view of a mold cap and a portion of the leadframe shown in the structure of FIG. 8.

Referring now to FIG. 11, therein is shown, somewhat figuratively, a mold cap 804 and a portion of the leadframe 802 from the leadframe and mold cap array 800 (FIG. 8). The mold cap size (or dimension) is represented by an arrow 1100, and the respective predetermined package body size (or dimension) of the package 1000 that will be formed following singulation is represented by an arrow 1102. The arrow 1100 is longer than the arrow 1102, showing that the size of the mold cap 804 is greater than the body size of the package 1000. It will be understood, of course, that similar size relationships obtain for the dimension of the mold cap 804 that is transverse to that shown in FIG. 11, and that the respective predetermined package body sizes of the several packages may be the same or different, as needed or desired.

It will be appreciated that the mold cap 804 is thus "oversize", affording physical support and protection for the portions of the leadframe 802 immediately outside the dimensions of the package body (the arrow 1102). This facilitates direct singulation by sawing, such as by the saw 900. As can be seen, the saw 900 and the mold cap 804 are positioned to saw through the mold cap 804 at the width of the package body (the arrow 1102). A similar cut is made on the opposite side, as will be readily understood, and corresponding cuts are made on the transverse front and rear sides of the mold cap 804 at a spacing appropriate to the package body size along that dimension. This singulates the package 1000 from the original mold cap 804 and the leadframe 802. The body size of the singulated package 1000 is then that of the arrow 1102 in the dimension illustrated in FIG. 11. As described, a similar result is obtained for the dimension in the transverse (or crosswise) direction.

Figure 12:
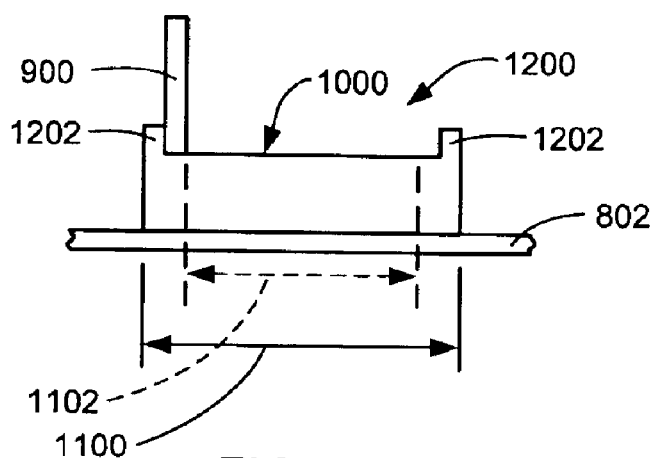
FIG. 12 is a figurative view of a mold cap similar to that shown in FIG. 11 but having an integral ridge sawing guide.

Referring now to FIG. 12, therein is shown, somewhat figuratively, a mold cap 1200 similar to the mold cap 804 shown in FIG. 11, but having an integral sawing guide in the form of ridges 1202 molded therein. The ridges 1202 are raised elements that are molded into the top of the mold cap 1200 along the sides thereof to define corresponding saw blade positions for the sawing singulation of the package 1000. The ridges 1202 are utilized to position, stabilize, guide, and assist the saw 900, as illustrated, for more accurately singulating the package 1000 from the mold cap 1200.

Figure 13:
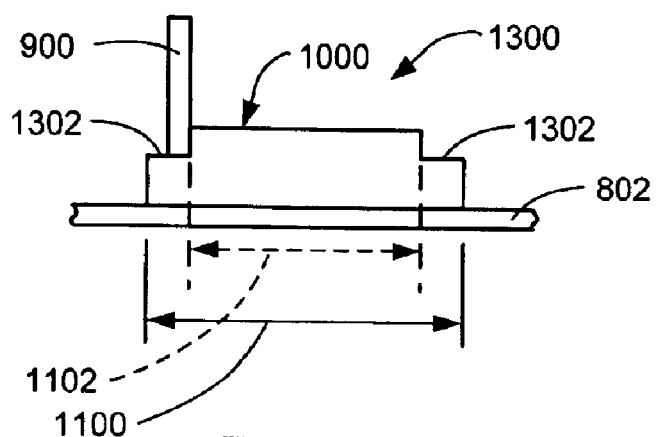
FIG. 13 is a figurative view of a mold cap similar to that shown in FIG. 11 but having an integral slot sawing guide.

Referring now to FIG. 13, therein is shown, somewhat figuratively, a mold cap 1300 similar to the mold cap 804 shown in FIG. 11, but provided with an integral sawing guide in the form of slots 1302 at the sides of the mold cap 1300. As shown, the slots 1302 afford integral mold cap sawing guide process and assistance improvements similar to that afforded by the ridges 1202 (FIG. 12).

Figure 14:
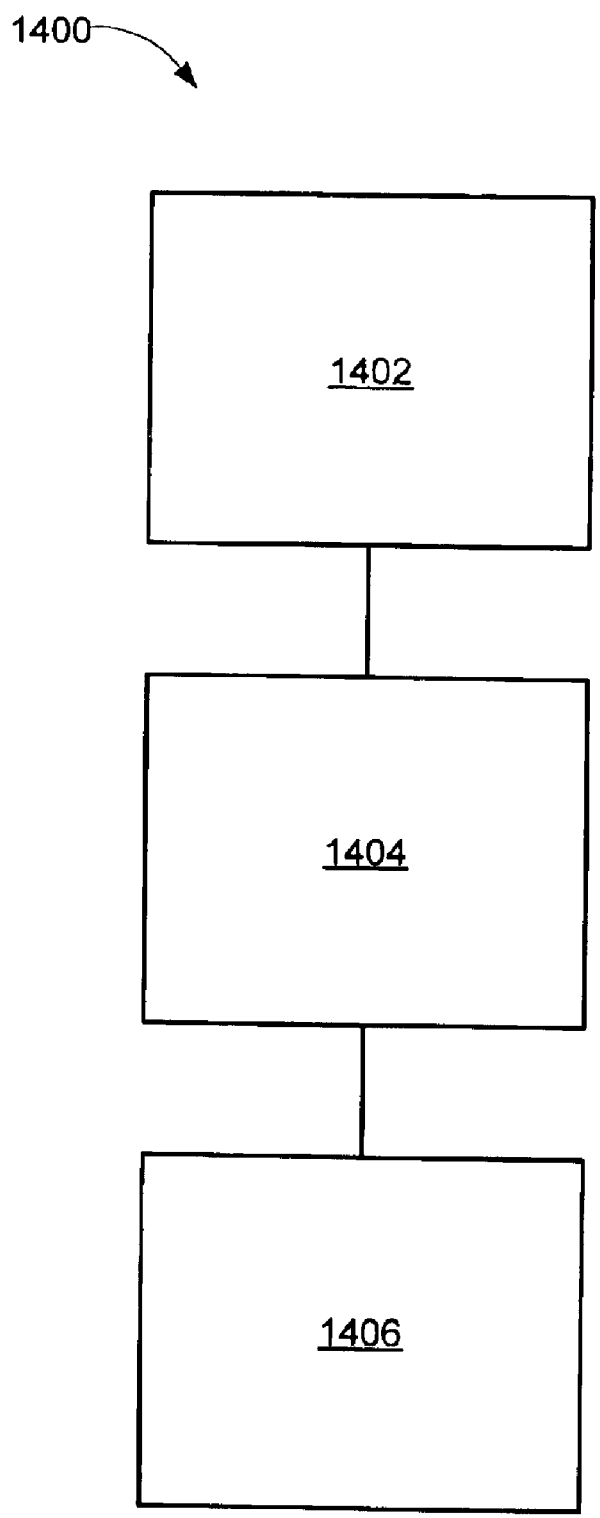
FIG. 14 is a flow chart of a method for fabricating semiconductor packages in accordance with the present invention.

Referring now to FIG. 14, therein is shown a flow chart of a method 1400 for fabricating semiconductor packages in accordance with the present invention. The method 1400 includes providing a leadframe for packages that are to be singulated with respective predetermined package body sizes, in a block 1402; forming individual mold caps on the leadframe with mold cap dimensions that are larger than the respective predetermined package body sizes, in a block 1404; and sawing the mold caps and leadframe to singulate packages therefrom and reduce the dimensions of the mold caps to the respective predetermined package body sizes, in a block 1406.

With reference to the drawing FIGs., the manufacturing method for fabricating the semiconductor packages 1000 is performed as follows:

1. The mold caps 804 are formed on the array leadframe 802, the mold caps 804 being noticeably larger in their lateral dimensions than the sizes of the individual leadframe bodies over which the mold caps 804 are formed, and larger than the body size of the package 1000 that will be singulated therefrom. (FIGS. 8 and 11)
2. The packages 1000 are then singulated from the leadframe and mold cap array 800 by sawing singulation, reducing the dimensions of the mold caps to the respective singulated package body sizes. (FIGS. 8–11).

The final structure is an economical, compact, high integrity package that benefits from the advantages of array leadframe formation and the advantages of saw singulation.

Thus, it has been discovered that the method for fabricating semiconductor packages, and the arrays utilized in the fabrication thereof, according to the present invention, furnish important and heretofore unavailable solutions, capabilities, and functional advantages. By eliminating the tape-attached leadframe, for example, it is no longer necessary to contend with outgassing, with warpage from differences in thermal expansion coefficients, and with difficulties in testing and identifying package rejects.

Another advantage is that the full transverse dimensions of each leadframe can be utilized, with no excess portion disposed outside the mold cap. This confers greater functionality while enabling smaller package sizes.

Still another advantage is the elimination of the singulation-generated debris that can occur with punch singulation.

By sawing rather then punching, the present invention additionally avoids the need for customized punches, punch dies, and strippers to match the particular dimensions of individual package body sizes.

Another advantage is the better mold cap formation that is made possible by forming the mold caps in pocket molds. Pocket molding of the mold caps affords better control of the mold flow (for example, turbulent flow prevention) in the mold cavities. This reduces voiding risks that can occur with block molding on a tape-attached leadframe.

A still further advantage is the prevention of mold voids caused by air pockets. Such voids can be prevented, for example, by raised mold cap features such as the integral ridges 1202 (FIG. 12) that form the sawing guides. Such air pockets, when present, are captured in the raised ridges, thereby removing the air-pocket mold voids from the mold caps themselves.

Most notably, the present invention combines the functional and process advantages of punch singulation processes and saw singulation processes while avoiding the disadvantages thereof.

The resulting processes and configurations are straightforward, economical, uncomplicated, highly versatile and effective, use conventional technologies, and are thus readily suited for manufacturing semiconductor packages in the widest of varieties, dimensions, and configurations.

While the invention has been described in conjunction with a specific best mode, it is to be understood that many alternatives, modifications, and variations will be apparent to those skilled in the art in light of the aforegoing description. Accordingly, it is intended to embrace all such alternative, modifications, and variations which fall within the scope of the included claims. All matters hithertofore set forth herein or shown in the accompanying drawings are to be interpreted in an illustrative and non-limiting sense.

The invention claimed is:

1. A method for fabricating semiconductor packages, comprising:
    providing a leadframe for packages that arm to be singulated with respective predetermined package body sizes;
    forming individual mold caps on the leadframe with mold cap dimensions that are larger than the respective predetermined package body sizes; and
    sawing the mold caps and leadframe to singulate packages therefrom and reduce the dimensions of the mold caps to the respective predetermined package body sizes.

2. The method of claim 1 wherein providing a leadframe and forming individual mold caps thereon further comprise providing a leadframe and forming individual mold caps thereon having spacing closer together than the spacings of leadframes and mold caps for a corresponding punch singulation leadframe.

3. The method of claim 1:
    further comprising forming integral sawing guides on the mold caps; and
    wherein sawing the mold caps and leadframe further comprises sawing the mold caps and leadframe with a saw blade and utilizing the integral sawing guides to assist the saw blade.

4. The method of claim 3 wherein forming the integral swing guides further comprises forming raised ridges on the mold caps.

5. The method of claim 3 wherein forming the integral sawing guides further comprises forming slots in the mold caps.

6. The method of claim 1 wherein forming individual mold caps on the leadframe further comprises forming mold caps by pocket molding.

7. The method of claim 1 wherein sawing the mold caps and leadframe to singulate packages therefrom further comprises sawing a tape free leadframe to singulate the packages.

8. A method for fabricating semiconductor packages, comprising:
    providing an array leadframe for packages that are to be singulated with respective predetermined package body sizes;
    forming individual mold caps on the array leadframe by pocket molding the mold caps with mold cap lateral dimensions that are larger than the respective predetermined package body sizes; and
    sawing the mold caps and array leadframe to singulate packages therefrom and reduce the lateral dimensions of the mold caps to the respective predetermined package body sizes.

9. The method of claim 8 wherein providing an array leadframe and forming individual mold caps on the array leadframe further comprise providing an array leadframe and forming individual mold caps thereon having spacings closer together than the spacings of leadframes and mold caps for a corresponding punch singulation leadframe array.

10. The method of claim 8:
   further comprising forming integral sawing guides on the mold caps; and
   wherein sawing the mold caps and array leadframe further comprises sawing the mold caps and array leadframe with a saw blade and utilizing the integral sawing guides to assist the saw blade.

11. The method of claim 10 wherein forming the integral sawing guides further comprises forming raised ridges on the mold caps.

12. The method of claim 10 wherein forming the integral sawing guides further comprises forming slots in the mold caps.

13. The method of claim 8 wherein sawing the mold caps and array leadframe to singulate packages therefrom further comprises sawing a tape free leadframe to singulate the packages.

* * * * *